United States Patent [19]

Nagasawa et al.

[11] 4,376,657

[45] Mar. 15, 1983

[54] METHOD OF MAKING FAULT-FREE SURFACE ZONE IN SEMICONDUCTOR DEVICES BY STEP-WISE HEAT TREATING

[75] Inventors: Kazutoshi Nagasawa, Odawara; Seigo Kishino, Hachioji; Yoshiaki Matsushita; Masaru Kanamori, both of Tokyo, all of Japan

[73] Assignee: VLSI Technology Research Association, Tokyo, Japan

[21] Appl. No.: 213,400

[22] Filed: Dec. 5, 1980

[30] Foreign Application Priority Data

Dec. 5, 1979 [JP] Japan .................... 54-157576

[51] Int. Cl.³ .................... H01L 21/322; H01L 7/52; H01L 21/263
[52] U.S. Cl. .................... 148/1.5; 148/187; 357/91; 427/82; 427/91
[58] Field of Search .................... 148/1.5, 187; 427/82, 427/93; 357/91

[56] References Cited

U.S. PATENT DOCUMENTS

| | | | |
|---|---|---|---|
| 4,042,419 | 8/1977 | Heinke | 148/1.5 |
| 4,116,719 | 9/1978 | Shimizu et al. | 148/1.5 |
| 4,149,905 | 4/1979 | Levinstein et al. | 148/1.5 |
| 4,154,873 | 5/1979 | Hickox et al. | 427/82 |
| 4,220,483 | 9/1980 | Cazcarra | 148/1.5 |
| 4,314,595 | 2/1982 | Yamamoto et al. | 148/1.5 |

FOREIGN PATENT DOCUMENTS 1349574 4/1974 United Kingdom .

OTHER PUBLICATIONS

Nagasawa et al., Appl. Phys. Letts. 37, (Oct. 1980), 622–624.
Matsushita et al., Jap. Jour. Appl. Phys. 19, (Feb. 1980), L101–L104.
Kishino et al., Jap. Jour. Appl. Phys. 19, (Aug. 1980), L–466–L468.
Kishino et al., Jour. Appl. Phys. 50, (Dec. 1979), 5241.
Hu, S. M., IBM-TDB, 20, (1977), 587.
Freeland et al., Appl. Phys. Letts. 30, (1977), 31.
Shimura et al., Appl. Phys. Letts. 37, (Sep. 1980), 483.
Shimizu et al., Jap. J. Appl. Phys. 17, (1978), 767.

*Primary Examiner*—Upendra Roy
*Attorney, Agent, or Firm*—Staas & Halsey

[57] ABSTRACT

In a gettering method for processing semiconductor wafers a semiconductor wafer such as a silicon wafer is first annealed in a non-oxidizing atmosphere, for example, in a nitrogen atmosphere, at a temperature in the range of 950° to 1,300° C., preferably at 1,050° C., for more than 10 minutes, for example for four (4) hours, to diffuse out oxygen near the surfaces of the semiconductor wafer. Then the semiconductor wafer is annealed at a temperature in the range of 600° to 800° C., for example at 650° C., for more than one hour, preferably for 16 hours, to create in the interior of the semiconductor wafer microdefects of high density.

9 Claims, 12 Drawing Figures

METHOD OF MAKING FAULT-FREE SURFACE ZONE IN SEMICONDUCTOR DEVICES BY STEP-WISE HEAT TREATING

BACKGROUND OF THE INVENTION

The present invention relates to a method of manufacturing semiconductor devices, and more particularly to a method of heat treating a semiconductor wafer such as a silicon wafer, first at a high temperature in a non-oxidizing atmosphere, then secondly at a temperature lower than the first mentioned temperature.

In the manufacture of semiconductor devices, including integrated circuits (IC), large scale integration (LSI) and so forth, defects brought about in the processes for fabrication of semiconductor devices and detrimental impurities, which were in the semiconductor wafer or which were mixed into the semiconductor wafer, were found to exert adverse effects on the operational characteristics of the device or device parameters, such as leakage currents, breakdowns, gain and so forth. Such defects and impurities not only shorten the lifetime of the device, but also cause very serious and adverse effects on the device parameters in the process of diffusions of impurities by causing spike diffusions, for example.

In order to prevent occurrence of such defects or to eliminate detrimental impurities, various gettering methods have been introduced into processes for fabrication of semiconductor devices, such as a method of roughening the back side of a semiconductor wafer by sandblast, gettering effected by implantation of ions onto the back side of a semiconductor wafer, and oxidization by hydrogen chloride. Recently, an intrinsic gettering method has been reported in which crystalline defects are created within or inside of a semiconductor wafer for the purpose of utilizing the defects as a sink for gettering.

While the above methods have several merits, it has come to be known, that these methods of gettering exhibit certain defects when applied to the manufacture of semiconductor devices. For example, the method of intentionally damaging the reverse side or back side of the semiconductor wafer by sandblast suffers from the fact that the front side of the semiconductor wafer is subjected to scratches and contaminations. The method of implantation of ions onto the back side of the semiconductor wafer suffers from the same defects as experienced in the sandblast method. The method of oxidizing by means of hydrogen chloride not only involves a lengthy gettering process but also has a further disadvantage in that the semiconductor wafer is warped in the process.

In the intrinsic gettering mentioned above, defects are created in the interior of the semiconductor wafer, and a region devoid of defects, the so-called denuded zone, is formed on the surface of the semiconductor wafer. For this purpose, two methods have been proposed. In the first method, the semiconductor wafer is annealed at a temperature higher than 1000° C. in a non-oxidizing atmosphere.

In a Japanese Patent Application No. 89111 (Filing Date: July 28, 1976) which was published without examination on 14 February 1978 under Publication No. 15764/1978, there is disclosed a gettering method in the fabrication of an oxide layer on an epitaxial layer grown on the front side of a semiconductor substrate. For the purpose of gettering, the semiconductor substrate is first annealed, in a non-oxidizing atmosphere, for one (1) to 20 hours at a temperature higher than 1,000° C. For example, the substrate is annealed in a nitrogen atmosphere or in a vacuum for two (2) hours at 1,200° C. The surface layers in the range of 0.1 to 10 $\mu$m of the semiconductor substrate are then removed by etching, for example, and an oxidizing process is then carried out at 1,000° C. in a wet oxygen atmosphere.

A Japanese Patent Application No. 94878 (Filing Date: Aug. 11, 1976), published without examination on Feb. 25, 1978 under Publication No. 20862/1978, discloses another gettering method wherein a semiconductor substrate on which an epitaxial layer has been grown is first heat treated at a temperature in the range of 1,000° to 1,200° C. for forming an oxide layer, then it is annealed in a nonoxidizing atmosphere for four (4) to 30 hours at a temperature in the range of 1,000° to 1,250° C. Thereafter, surface layers in the range of 10 to 50 or 60 $\mu$m of the semiconductor substrate are removed.

In the second method, the semiconductor wafer is first annealed in an oxidizing atmosphere at a low temperature below 800° C., then the semiconductor wafer is annealed in a non-oxidizing atmosphere at a high temperature above 1,000° C.

In order to create defects in the interior of the wafer according to the first method, the semiconductor wafer must be such that, when heat treated, oxygen in the crystal may be precipitated. However, with the so-called CZ wafers made by the Czochralski method currently on the market, it has been found that, although they contain a considerable amount of oxygen, oxygen is hardly precipitated. Because of this, it is difficult to create defects in the silicon crystal according to said method as illustrated in FIG. 1A to effect gettering. In this FIG. 1A, which shows a silicon wafer in cross-section, defects 3 are shown in the interior between the front side 1 and back side 2 of the silicon wafer. FIG. 1B is a graphic illustration of the defect density (ordinate) relative to the depth into the silicon wafer (abscissa).

In the second method mentioned above, microdefects are created as shown in FIGS. 2A and 2B by the first annealing step at a low temperature, and then by the subsequent higher temperature annealing step defects capable of gettering are created in the interior of the silicon wafer and denuded zones are formed on the surfaces of the silicon wafer as illustrated in FIGS. 2C and 2D. FIGS. 2A and 2C are views similar to FIG. 1A, and FIGS. 2B and 2D are similar to FIG. 1B, with the same reference numerals referring to the same parts. The second method is effective in overcoming the problem experienced in the first method that is, the difficulty of creating microdefects capable of gettering by a single heat treatment. However, as illustrated in FIG. 2D, a portion of the silicon wafer designated by reference numeral 4 has microdefects which were created near the surfaces by annealing at the low temperature and which cannot be completely eliminated by annealing at the high temperature. Accordingly these microdefects turn out to be macro-defects in subsequent processes, such as the diffusion process, etc. It has been found that portion 4 is very difficult to eliminate and portion 4 remains even if heat treatment is carried out for many hours. It was also found that the defect density in the interior of the silicon wafer becomes low if heat treatment is prolonged in order to eliminate portion 4 completely. It is to be understood that conditions for heat treatment are difficult to select because whether or not the portion 4 can be eliminated is influenced by the crystalline property of the silicon wafer.

SUMMARY OF THE INVENTION

It is an object of the invention to provide, without relying on the quality of semiconductor wafer as discussed above, a method to form denuded zones devoid of microdefects near the surfaces of the semiconductor wafer while creating in the interior of the semiconductor wafer such defects necessary to perform the gettering function.

In one embodiment of the invention, the semiconductor wafer is annealed at a temperature of 950° C.–1,300° C. in a non-oxidizing atmosphere for more than 10 minutes, but preferably less than 70 hours, to bring about diffusion out of oxygen near the surfaces of the semiconductor wafer. Then, the semiconductor wafer is annealed at a temperature in the range of 600° to 800° C. to create microdefects in the interior of the semiconductor wafer. Where the semiconductor wafer is subsequently heat treated, microdefects of high density capable of gettering grow in the interior of the semiconductor wafer to be microdefects of comparatively larger size. Near the surfaces, microdefects, such as stacking defects, are not created because the oxygen density is low.

The above and further objects and novel features of the invention will appear more fully from the following detailed description when read in connection with the accompanying drawings. It is to be expressly understood, however, that the drawings are not intended as a definition of the invention but are for the purpose of illustration only.

BRIEF DESCRIPTION OF THE DRAWINGS

In the drawings wherein like parts are marked alike.

DESCRIPTION OF THE PREFERRED EMBODIMENT

Figure 1A:
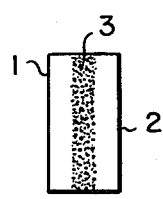
FIGS. 1A and 1B and as FIGS. 2A to 2D are cross-sectional views of semiconductor wafers processed by conventional intrinsic gettering methods and graphs showing the relationship between the defect density and the depth in such semiconductor wafer, respectively.
Figure 1B:
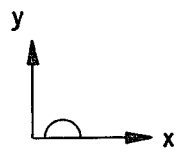
Figure 2A:
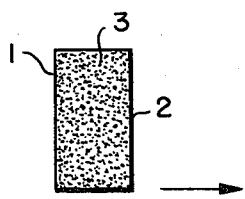
Figure 2C:
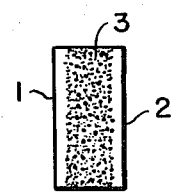
Figure 2B:
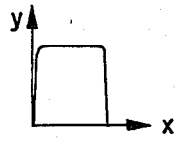
Figure 2D:
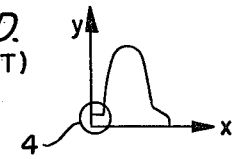
Figure 3A:
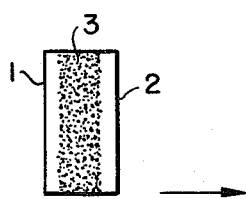
FIG. 3A to 3D are views, similar to FIGS. 2A to 2D of a semiconductor wafer processed according to the method of the invention and graphs showing the relationship between the defect density and the depth in such semiconductor wafer.

In a method of the invention, a silicon wafer is annealed in a non-oxidizing atmosphere at a temperature in the range of 950° to 1,300° C. for more than ten minutes but preferably less than 70 hours to diffuse out oxygen near the surfaces. The silicon wafer thus treated is illustrated in FIG. 3A, a cross-sectional view of the silicon wafer, and in FIG. 3B in which the ordinate represents the defect density shown by a solid line and oxygen content shown by, dotted line and the abscissa the depth into the silicon wafer.

Figure 3C:
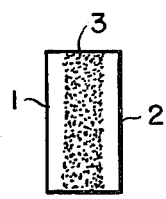
Figure 3B:
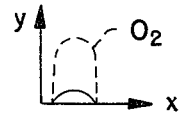
Figure 3D:
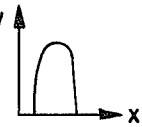

The silicon wafer is next annealed at a temperature in the range of 600° to 800° C. to create microdefects of high density. The silicon wafer after such heat treatment is shown in FIG. 3C, a cross-sectional view of the silicon wafer, and in FIG. 3D in which the relationship between defect density (ordinate) and depth into the silicon wafer (abscissa) is shown.

When the silicon wafer is subjected to subsequent processes for heat treatment of the silicon, microdefects of high density in the interior of the silicon wafer grow to become macrodefects capable of gettering, and near the surfaces of the silicon wafer, microdefects such as stacking defects, are not created because, the oxygen content is low. By carrying out this simple and effective method of gettering, not only defects brought about by the various processes are lessened, but creation of stacking defects caused by ion implantation may also be suppressed. Moreover, detrimental impurities that are mixed into the wafer during processing of the wafer perform the gettering. As a result, various electrical characterists such as lifetime, etc., of the semiconductor device are improved and the yield increased.

In the method of the invention, the first heat treatment is carried out at a temperature in the range of 950° to 1,300° C. At a temperature lower than 950° C., it has been confirmed that diffusion out of oxygen from the surfaces of the silicon wafer is decreased, creation of defects becomes difficult, and the effect of the invention becomes small. On the other hand, at a temperature higher than 1,300° C., it was also found that the effect of the cooling process becomes substantial, rendering it difficult to obtain stable characteristics in the wafer.

The second heat treatment is carried out at a temperature in the range of 600° to 800° C. At temperature lower than 600° C., the size of the nucleus formed becomes small. In subsequent heat treatment at high temperatures for fabrication of the device, the nucleus disappears and the effect of the invention cannot be obtained. Further, at a temperature higher than 800° C., density of the defects decreases. Unless it is big enough, the nucleus does not grow, and the effect of the invention is lessened.

One embodiment of the invention will be described in more detail. A (100) silicon single crystal CZ wafer made by the Czochralski method was heat treated for four (4) hours at 1,050° C. in a nitrogen atmosphere according to conventional techniques. By this heat treatment, the oxygen is diffusion out from the surface layer of a 10 μm depth of the silicon wafer. Next, the silicon wafer was heat treated for 16 hours at 650° C. in a oxygen atmosphere, also in accordance with conventional techniques, to achieve the silicon wafer according to the invention. Next, a condition was set under which defects appear the most at the front side of the crystal by heat treatment of the silicon wafer, that is, ions of boron were implanted onto the front side of the silicon wafer by conventional techniques, with a dosage of $3 \times 10^{14} cm^{-2}$, at 75 KeV. Thereafter, using conventional techniques, heat treatment was carried out at 1,050° C. for four (4) hours in a non-oxidizing atmosphere, followed by an oxidizing process at 1,100° C. for four (4) hours. After these processes, defects created at the surface were examined as follows:

A test piece processed as described above was etched as is known to the person skilled in the art, and the defects created at the surface and interior of the test piece were observed by microscope.

In a test piece processed according to conventional method, stacking defects of high density were created in the region where ions were implanted. In case of the silicon wafer processed according to the invention, creation of defects in the region where the ions were implanted was scarcely observed. Further, the silicon wafer test piece was split along planes of cleavage in order to investigate distribution of the defects in the direction of depth of the test piece, etched using conventional techniques, and observed. In the test piece according to the conventional methods, defects created in the interior of the test piece were not many. With the test piece according to the method of the invention, denuded zones without defects were observed near the surface, with defects of high density created in the interior of the test piece. It was thus confirmed that, in the test piece according to conventional methods, damage, impurities, etc., created by implantation of ions became nuclei of defects near the surface created in the subsequent heating and oxidizing processes whereas in the silicon wafer according to the method of the invention, defects were not created at the surface even if heating and oxidizing processes were carried out due to the low content of oxygen near the surface and the gettering of the defects in the interior of the silicon wafer.

Figure 4:
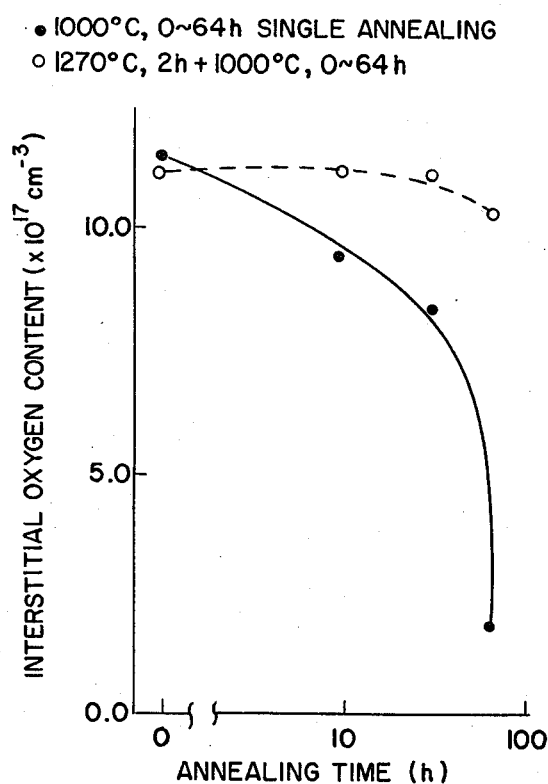
FIGS. 4 and 5 are graphs showing the relationship between the interstitial oxygen content and the annealing time for a semiconductor wafer processed according to the method of this invention.
Figure 5:
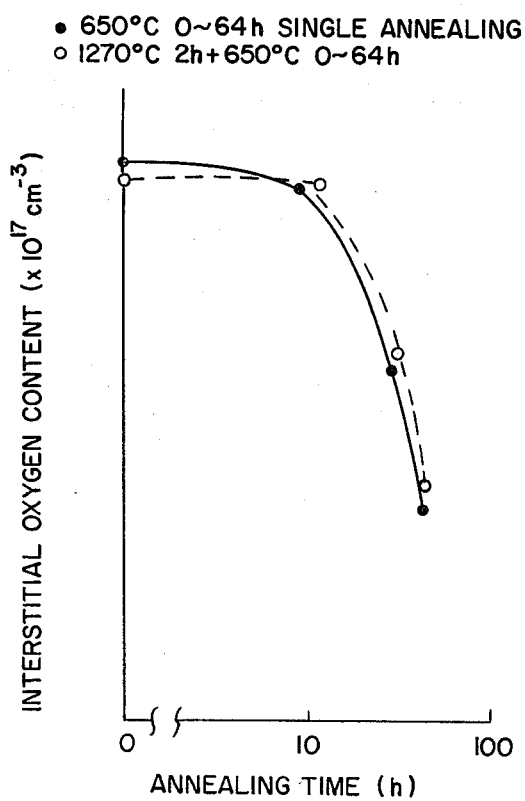

FIGS. 4 and 5 show graphs illustrating the relationship between the interstitial oxygen content and the annealing time by logarithmic scale of various silicon pieces processed as discussed below. Interstitial oxygen content shows concentration of oxygen in the silicon crystal, and if the content is high, less defects are created. The solid lines in the graphs of FIGS. 4 and 5 represent results of a single annealing at 1,000° C. and 650° C. respectively, while the dotted lines represent results of a first annealing at 1,270° C. for two (2) hours followed by a second annealing at 1,000° C. (FIG. 4) and at 650° C. (FIG. 5). These results show that a nucleation of oxygen precipitates occurs at a temperature around 650° C. with or without a high temperature preannealing. However, the nucleation hardly occurs at temperatures around 1000° C. if a higher temperature preannealing is added. As a result, the nucleation occurs at a temperature around 650° C. regardless of the crystalline quality of the starting silicon wafer. It should be noted, however, that the results of annealing according to the method of the invention does not depend considerably on the crystalline property of the silicon wafer processed.

As has been described, the semiconductor wafer processed according to the invention has significant advantages in that defects brought about by ion implantation which are most likely to cause defects during fabrication of the semiconductor device are effectively reduced while heavy metals that are in the semiconductor wafer or that mix into the semiconductor wafer in the fabrication process can be expected to be gettered. The life expectancy measured for wafers processed by the gettering method described above were several times longer than that of wafers processed by conventional methods.

In the semiconductor wafer processed by the present invention defect density may be substantially reduced near the surfaces of the wafer even with subsequent processes performed on the semiconductor wafer liable to create defects, such as ion implantation, heat treatment for oxidizing purposes, etc. Accordingly reduction of leakage currents, longer life expectancy, improvement of gain, and other flatures which contribute to improved operational characteristics and yield of the semiconductor device can be achieved by the invention.

Active elements of the semiconductor device or passive elements are formed in the denuded zone of the surface of the silicon semiconductor wafer of the present invention.

For this purpose, a field oxide layer may be formed on the surface of the silicon wafer by conventional selective oxidation by using a silicon nitride as a mask. In the selective oxidation process, the field oxide layer of an 8000 Å thickness is formed by heat treatment at 1100° C., for four (4) hours in wet oxygen atmosphere. However, the denuded zones and the microdefects capable of gettering in the silicon wafer according to the present invention are not changed in size and amount.

In yet another method active elements and/or passive elements are formed on a silicon epitaxial layer which is formed on the surface of the silicon semiconductor wafer according to the present invention.

In the epitaxial growth process, the epitaxial layer is grown by a heat treatment at 1100°~1200° C. in a hydrogen atmosphere, for example. However, the denuded zones and the microdefects capable of gettering in the silicon wafer according to the present invention are not changed in size and amount. In this case, characteristics of the epitaxial layer and electrical characteristics of the active elements and/or passive elements are improved.

Thus, the invention having been described in its best embodiment and mode of operation, that which is claimed and desired to be protected by Letters Patent is:

We claimed:

1. In a method of manufacturing a semiconductor device, a method of forming in a semiconductor wafer denuded zones near the surfaces thereof without creating microdefects but creating in the interior of the semiconductor wafer microdefects capable of gettering, comprising the steps of:

heat treating said semiconductor wafer at a temperature in the range of 950° to 1,300° C. for more than 10 minutes but preferably less than 70 hours in a non-oxidizing atmosphere, and heat treating thereafter at a temperature in the range of 600° to 800° C. at least for one hour.

2. The method of claim 1 wherein said semiconductor wafer is a silicon wafer.

3. The method of claim 1 wherein in said first heat treating step said semiconductor wafer is heat treated at 1,050° C. for four (4) hours in a nitrogen atmosphere to diffuse out oxygen near the surfaces of said semiconductor wafer.

4. The method of claim 1 or 3 wherein in said second heat treating step said semiconductor wafer is heat treated at 650° C. for 16 hours to create in the interior of said semiconductor wafer microdefects of high density.

5. The method of claim 3 wherein said semiconductor wafer is a silicon wafer.

6. The method of claim 4 wherein said semiconductor wafer is a silicon wafer.

7. The method of claim 2 or 3 further comprising the step of forming a field oxide layer on the surface of said semiconductor wafer by heat treatment, wherein the denuded zones near the surface and the microdefects in the interior capable of gettering remain substantially unchanged.

8. The method of claim 4 further comprising the step of forming a field oxide layer on the surface of said semiconductor wafer by heat treatment, wherein the denuded zones near the surface and the microdefects in the interior capable of gettering remain substantially unchanged.

9. The method of claim 2 or 3 further comprising the step of forming a silicon epitaxial layer on the surface of said semiconductor wafer by heat treatment, wherein the denuded zones near the surface and the microdefects in the interior capable of gettering remain substantially unchanged.

* * * * *

UNITED STATES PATENT AND TRADEMARK OFFICE
CERTIFICATE OF CORRECTION

PATENT NO. : 4,376,657

DATED : Mar. 15, 1983

INVENTOR(S) : Nagasawa et al.

It is certified that error appears in the above-identified patent and that said Letters Patent is hereby corrected as shown below:

Front page, [56] References Cited, "Heinke" should be --Heinke et al.--.

Column 1, line 9, after "wafer" insert --,--.
Column 2, line 52, after "method" insert --,--.
Column 3, line 42, "FIG." should be --FIGS.--;
    line 42, after "2D" insert --,--;
    line 62, "," should be --a--.
Column 4, line 8, delete "," (second occurrence);
    line 16, "characterist" should be --characteristics--;
    line 64, "method" should be --methods--.
Column 5, line 39, "does" should be --do--;
    line 55, after "invention" insert --,--;
    line 64, "and of the semiconductor device or" should be --and/or--;
    line 65, after "elements" insert --of the semiconductor device--.

UNITED STATES PATENT AND TRADEMARK OFFICE
CERTIFICATE OF CORRECTION

PATENT NO. : 4,376,657

DATED : Mar. 15, 1983

INVENTOR(S) : Nagasawa et al.

It is certified that error appears in the above-identified patent and that said Letters Patent is hereby corrected as shown below:

```
Column 6, line 8, after "method" insert --,--;
    line 9, "are" should be --of the semiconductor device may
    be--;
    line 22, delete "claimed and".
```

*Signed and Sealed this*

*Twenty-eighth* Day of *February 1984*

[SEAL]

*Attest:*

GERALD J. MOSSINGHOFF

*Attesting Officer*     *Commissioner of Patents and Trademarks*